(12) United States Patent
Wang

(10) Patent No.: US 9,626,017 B2
(45) Date of Patent: Apr. 18, 2017

(54) TOUCH PANEL AND MANUFACTURING METHOD THEREOF, DISPLAY DEVICE

(71) Applicants: CHENGDU BOE OPTOELECTRONICS TECHNOLOGY CO., LTD., Chengu, Sichuan Province (CN); BOE TECHNOLOGY GROUP CO., LTD., Beijing (CN)

(72) Inventor: Benlian Wang, Beijing (CN)

(73) Assignees: CHENGDU BOE OPTOELECTRONICS TECHNOLOGY CO., LTD., Chengdu, Sichuan Province (CN); BOE TECHNOLOGY GROUP CO., LTD., Beijing (CN)

( * ) Notice: Subject to any disclaimer, the term of this patent is extended or adjusted under 35 U.S.C. 154(b) by 360 days.

(21) Appl. No.: 14/348,155

(22) PCT Filed: May 31, 2013

(86) PCT No.: PCT/CN2013/076594
§ 371 (c)(1),
(2) Date: Mar. 28, 2014

(87) PCT Pub. No.: WO2014/166150
PCT Pub. Date: Oct. 16, 2014

(65) Prior Publication Data
US 2015/0145787 A1   May 28, 2015

(30) Foreign Application Priority Data

Apr. 12, 2013 (CN) .......................... 2013 1 0127434

(51) Int. Cl.
*G06F 3/041* (2006.01)
*G06F 3/044* (2006.01)
*H01L 21/027* (2006.01)

(52) U.S. Cl.
CPC .............. *G06F 3/041* (2013.01); *G06F 3/044* (2013.01); *H01L 21/027* (2013.01); *G06F 2203/04103* (2013.01); *Y10T 29/413* (2015.01)

(58) Field of Classification Search
CPC ............................... G06F 3/041–3/047; G06F 2203/04101–2203/04113; H01L 21/027; Y10T 29/413
(Continued)

(56) References Cited

U.S. PATENT DOCUMENTS

2010/0309151 A1* 12/2010 Cheng .................... G06F 3/045
345/173
2011/0207055 A1* 8/2011 Jun ......................... G06F 3/044
430/313
(Continued)

FOREIGN PATENT DOCUMENTS

CN  102163095 A   8/2011
CN  102375635 A   3/2012
(Continued)

OTHER PUBLICATIONS

International Preliminary Report on Patentability issued Oct. 13, 2015; PCT/CN2013/076594.
(Continued)

*Primary Examiner* — Stephen Sherman
(74) *Attorney, Agent, or Firm* — Ladas & Parry LLP

(57) ABSTRACT

Embodiments of the present invention provide a touch panel and a manufacturing method thereof, as well as a display device. The touch panel includes a first sensing electrode layer, a second sensing electrode layer and an insulating
(Continued)

layer between the first sensing electrode layer and the second sensing electrode layer, wherein the first sensing electrode layer includes first sensing electrode patterns; the second sensing electrode layer includes second sensing electrode patterns; and the insulating layer includes insulating patterns, a shape of the insulating patterns is the same as that of the first sensing electrode patterns or the second sensing electrode patterns.

8 Claims, 1 Drawing Sheet

(58) Field of Classification Search
USPC ......... 345/173–178; 178/18.01–18.09, 18.11
See application file for complete search history.

(56) References Cited

U.S. PATENT DOCUMENTS

| | | |
|---|---|---|
| 2012/0044191 A1 | 2/2012 | Shin |
| 2012/0262385 A1 | 10/2012 | Kim et al. |

FOREIGN PATENT DOCUMENTS

| | | |
|---|---|---|
| CN | 102622117 A | 8/2012 |
| CN | 102955612 A | 3/2013 |
| WO | 2012/108068 A | 8/2012 |

OTHER PUBLICATIONS

Second Chinese Office Action Appln. No. 201310127434.3; Dated Dec. 29, 2015.

First Chinese Office Action Appln. No. 201310127434.3; Dated Jun. 9, 2015.

International Search Report mailed Jan. 23, 2014; PCT/CN2013/076594.

Third Chinese Office Action dated Jan. 25, 2017; Appln. No. 201310127434.3.

* cited by examiner

TOUCH PANEL AND MANUFACTURING METHOD THEREOF, DISPLAY DEVICE

TECHNICAL FIELD

The present invention relates to a touch panel and a manufacturing method thereof, as well as a display device.

BACKGROUND

Touch screens, also known as "touch-control screens", are the most simple, convenient and natural man machine interaction devices at present. They provide multimedia with a new appearance and greatly facilitate life, hence becoming an attractive, brand-new multimedia interaction equipment.

A touch screen mainly realizes touch function by a touch panel. As shown in FIGS. 1 and 2, a conventional touch panel includes a substrate 1, a plurality of rows of first sensing electrode patterns 2 in a first direction, and a plurality of rows of second sensing electrode patterns 4 in a second direction disposed on the substrate 1, with insulating patterns 3 disposed between the first sensing electrode patterns 2 and the second sensing electrode patterns 4 to insulate the first sensing electrode patterns 2 and the second sensing electrode patterns 4 from each other. In the manufacturing process of the touch panel, the first sensing electrode patterns, the second sensing electrode patterns and the insulating patterns are formed by one exposure respectively and each exposure uses one mask respectively, which causes a high manufacturing cost.

SUMMARY

Embodiments of the present invention provide a touch panel and a manufacturing method thereof, as well as a display device, in which an insulating layer of the touch panel may be patterned by a same mask with the first sensing electrode layer or the second sensing electrode layer, thereby one mask is saved and costs are lowered.

One aspect of the present invention provides a touch panel comprising a first sensing electrode layer, a second sensing electrode layer, and an insulating layer between the first sensing electrode layer and the second sensing electrode layer. The first sensing electrode layer includes first sensing electrode patterns; the second sensing electrode layer includes second sensing electrode patterns; and the insulating layer includes insulating patterns. A shape of the insulating patterns is the same as that of the first sensing electrode patterns or the second sensing electrode patterns.

Another aspect of the present invention provides a manufacturing method for the touch panel provided in the present invention, including steps of forming the first sensing electrode layer, forming the insulating layer and forming the second sensing electrode layer; forming of the first sensing electrode layer and the insulating layer uses a same mask for patterning, or forming of the insulating layer and the second sensing electrode layer uses a same mask for patterning.

For example, the insulating layer and the first sensing electrode layer or the second sensing electrode layer are formed by one patterning process.

For example, forming of the insulating layer and the first sensing electrode layer by one patterning process comprises: forming a first sensing electrode film on the substrate; forming an insulating film on the substrate; coating photoresist on the substrate formed with the first sensing electrode film and the insulating film; exposing and developing the substrate formed with the photoresist with a mask, remaining parts of the photoresist after development corresponding to the first sensing electrode patterns and the insulating patterns, and other parts of photoresist being completed removed; etching regions of the first sensing electrode film and the insulating film not covered by the photoresist; removing the photoresist.

For example, forming of the insulating layer and the second sensing electrode layer by one patterning process comprises: forming an insulating film on the substrate; forming a second sensing electrode film on the substrate; coating photoresist on the substrate formed with the insulating film and the second sensing electrode film; exposing and developing the substrate formed with the photoresist with a mask, remaining parts of the photoresist after development corresponding to the insulating patterns and the second sensing electrode patterns, and other parts of photoresist being completed removed; etching regions of the insulating film and the second sensing electrode film not covered by the photoresist; removing the photoresist.

For example, the mask comprises completely transparent regions and opaque regions; where the photoresist is positive photoresist, opaque regions of the mask correspond to remaining parts of the photoresist, and photoresist corresponding to the transparent regions is completely removed; or where the photoresist is negative photoresist, transparent regions of the mask correspond to remaining parts of the photoresist, and photoresist corresponding to the opaque regions is completely removed.

Yet another aspect of the present invention provides a display device including the touch panel provided in the present invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS

Figure 1:
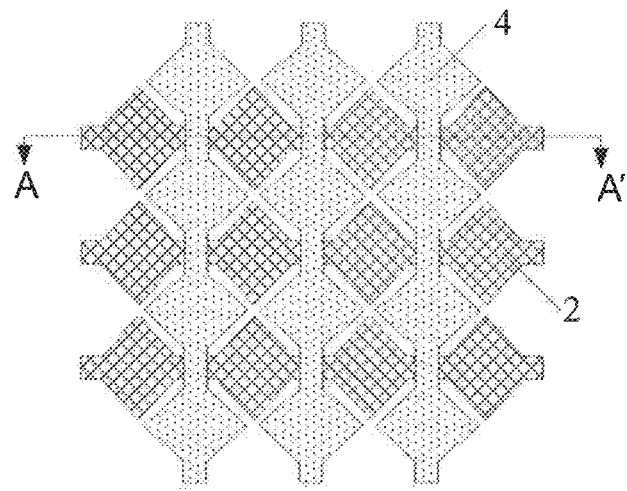
FIG. 1 is a structural top view of a conventional touch panel.
Figure 2:
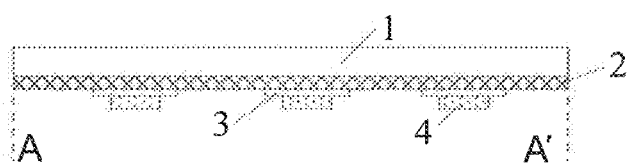
FIG. 2 is a structural sectional view of the touch panel shown in FIG. 1.

1—Substrate; 2—First Sensing Electrode Patterns; 3—Insulating Patterns; 4—Second Sensing Electrode Patterns.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," and the like are not intended to limit the amount, but indicate the existence of at lease one. The terms "comprises," "comprising," "includes," "including," and the like, are intended to specify that the elements or the objects stated before these terms encompass the elements or the objects and equivalents thereof listed after these terms, but do not preclude the other elements or objects. The phrases "connect", "connected" and the like are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An embodiment of the present invention provides a touch panel including a first sensing electrode layer, a second sensing electrode layer, and an insulating layer between the first sensing electrode layer and second sensing electrode layer. The first sensing electrode layer includes first sensing electrode patterns; the second sensing electrode layer includes second sensing electrode patterns; and the insulating layer includes insulating patterns. The shape of the insulating patterns is the same as that of the first sensing electrode patterns or second sensing electrode patterns.

In this disclosure, definitions of "film", "layer" and "pattern" and relationship between them are explained here. A "film" refers to a film formed by deposition or the like processes on a substrate with a certain material. If in the entire manufacturing process, this "film" undergoes no patterning process, this "film" may also be called a "layer"; if in the entire manufacturing process, this "film" undergoes a patterning process, it is called as a "film" before patterning, and called as a "layer" after patterning. A "layer" after patterning process includes at least one "pattern" of film.

Illustratively, the above-mentioned first sensing electrode layer may be the first sensing electrode patterns formed by depositing an ITO (indium tin oxide) film on a transparent substrate and the patterning the film. In this text, "patterning process" refers to a process of forming a film into a layer containing at least one pattern. A patterning process typically includes: coating photoresist on the film, exposing the photoresist with a mask, and then washing out the photoresist to be removed, then etching parts of the film not covered by the photoresist, and finally peeling off the remaining photoresist. While in all embodiments of the present invention, "one patterning process" means a process to form a desired layer structure by one exposure process.

Figure 3:
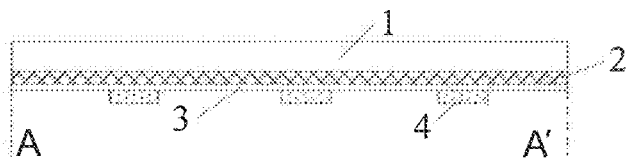
FIG. 3 is a structural sectional view of a touch panel provided in an embodiment of the present invention.
Figure 4:
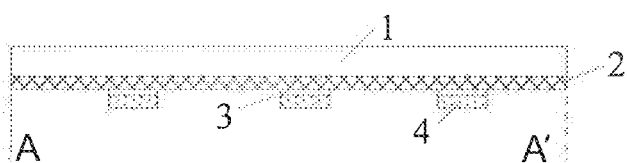
FIG. 4 is a structural sectional view of another touch panel provided in an embodiment of the present invention.

The insulating patterns are the same as the first sensing electrode patterns or the second sensing electrode patterns, then the insulating layer may be formed by one patterning process along with the first sensing electrode layer or second sensing electrode layer, and then it is possible to reduce the time for exposures. The shape of the insulating patterns 3 is the same as the first sensing electrode patterns 2, namely as shown in FIG. 3; and the shape of the insulating patterns 3 is the same as the second sensing electrode patterns 4, namely as shown in FIG. 4.

It is to be noted that, the touch panel provided in an embodiment of the present invention may further include other film or layer structures, for example, the touch panel may further include a black matrix film layer and a color filter layer. Since the other film or layer structures provided is not relevant to the gist of the present invention, the description therefor will not be given in the embodiments of the present invention, it is enough to use known or future-developed structures and processes.

In a touch panel provided in an embodiment of the present invention, the shape of insulating patterns on the touch panel is the same as the first sensing electrode patterns or the second sensing electrode patterns, thus during manufacturing of the touch panel, the insulating patterns and the first sensing electrode patterns are formed by using a same mask, or the insulating patterns and the second sensing electrode patterns are formed by using a same mask. Therefore, the embodiment of the present invention reduces one mask and save costs compared to the conventional technology in which the insulating layer is patterned by using one mask.

An embodiment of the present invention provide a manufacturing method for the touch panel provided in an embodiment of the present invention, including steps of: forming a first sensing electrode layer, forming an insulating layer and forming a second sensing electrode layer. A same mask is used to form the first sensing electrode layer and the insulating layer, or a same mask is used to form the insulating layer and the second sensing electrode layer.

For example, forming of the first sensing electrode layer, forming of the insulating layer and forming of the second sensing electrode layer are each realized by one patterning process, that is, including steps of depositing a film, coating photoresist, exposing and developing the photoresist with a mask, etching, and removing. Then, if the insulating patterns are the same as the first sensing electrode patterns, the first sensing electrode layer and the insulating layer may be formed with a same mask; alternatively, if the insulating patterns are the same as the second sensing electrode patterns, the insulating layer and the second sensing electrode layer may be formed with a same mask. Compared with the conventional technology, the mask for the insulating layer is reduced and manufacturing costs can be saved.

For example, the insulating layer and the first sensing electrode layer or the second sensing electrode layer are formed by one patterning process. This could further shorten the production period.

One example of forming the insulating layer and the first sensing electrode layer by one patterning process includes the following steps S101-S106.

Step S101, forming a first sensing electrode film on a substrate.

For example, it is possible to faulting an ITO transparent film by deposition on a transparent substrate, and a material for forming the first sensing electrodes may also be other substances, for example, it may be ZnO (zinc oxide) or AZO (aluminum doped zinc oxide). In an embodiment of the present invention, detail description is given with an example in which materials for forming the first sensing electrodes and second sensing electrodes are both ITO.

Step S102, forming an insulating film on the substrate.

For example, it is possible to form a SiNx (silicon nitride) film by deposition on the substrate formed with the first sensing electrode film, and the material for forming the insulation film may also be other substances, such as silicon dioxide. In an embodiment of the present invention, detail description will be given with an example in which the material for forming the insulating film is silicon nitride.

Step S103, coating photoresist on the substrate formed with the first sensing electrode film and the insulating film.

It is to be noted that, the mask may include completely transparent regions and opaque regions.

If the photoresist is positive photoresist, opaque regions of the mask correspond to remaining parts of the photoresist while photoresist corresponding to the transparent regions is completely removed; or if the photoresist is negative photoresist, transparent regions of the mask correspond to remaining parts of the photoresist while photoresist corresponding to the opaque regions is completely removed. In an embodiment of the present invention, detail description will be given with an example in which the photoresist is positive photoresist.

Step S104, exposing and developing the substrate formed with the photoresist with a mask, remaining parts of the photoresist after development corresponding to the first sensing electrode patterns and the insulating patterns, and other photoresist is completely removed.

If the photoresist is positive photoresist, then opaque regions corresponding to the mask correspond to remaining parts of the photoresist, that is, correspond to the first sensing electrode patterns and the insulating patterns. If the photoresist is negative photoresist, then respective transparent regions of the mask correspond to remaining parts of the photoresist, that is, correspond to the first sensing electrode patterns and the insulating patterns.

Step S105, etching regions of the first sensing electrode film and the insulation film not covered by photoresist.

For example, regions of the first sensing electrode film not covered by photoresist may be etched by a wet process, namely etching regions of the first electrode film not covered by photoresist with an etching solution; and the insulating film may be etched by a dry process, namely etching regions of the insulating film not covered by photoresist by gas bombing.

Step S106, removing the photoresist.

It is to be noted that the above is only steps of manufacturing the first sensing electrode layer and the insulating layer, that is, part of steps rather than all steps of manufacturing a touch panel, and when the touch panel is further provided with other film or layer structures, the manufacturing method provided in an embodiment of the present invention and other manufacturing methods for the film or layer structures in a conventional technology may be referred to, which will not be described any more.

Alternatively, one example of forming the insulating layer and the second sensing electrode layer by one patterning process includes the following steps S201-S206:

Step S201, forming an insulating film on the substrate.

For example, it is possible to form a SiNx film by deposition on the substrate formed with the first sensing electrodes.

Step S202, forming a second sensing electrode film on the substrate.

For example, it is possible to form an ITO transparent film by deposition on the substrate formed with the insulating film.

Step S203, coating photoresist on the substrate formed with the insulating film and the second sensing electrode film.

For example, for the above-mentioned step S203, coating photoresist on the substrate formed with the insulating film and the second sensing electrode film may refer to the above-mentioned step S103 of coating photoresist on the substrate formed with the first sensing electrode film and the insulating film.

Step S204, exposing and developing the substrate formed with the photoresist with a mask, remaining parts of the photoresist after development corresponding to the insulating patterns and the second sensing electrode patterns, and other parts of photoresist being completed removed.

The above-mentioned step S104 may be referred to for the above-mentioned step S204.

Step S205, etching regions of the insulating film and the second sensing electrode film not covered by photoresist.

For example, in step S205, etching the insulating film and the second sensing electrode film in regions where photoresist is completely removed may be accomplished according to the above-mentioned step S105 of etching the first sensing electrode film and the insulating film in regions where photoresist is completely removed.

Step S206, removing the photoresist.

It is to be noted that the above are only steps of manufacturing the insulating layer and the second sensing electrode layer, that is, part of steps rather than all steps of manufacturing the touch panel, and when the touch panel is further provided with other film or layer structures, the manufacturing method provided in an embodiment of the present invention and other manufacturing methods for the film or layer structures in a conventional technology may be referred to, which will no be described any more here.

An embodiment of the present invention provide a display device including the touch panel provided in an embodiment of the present invention. The display device may be a display device with touch function such as liquid crystal display, electronic paper, OLED (organic light emitting diode) display, and any products or components with touch function such as televisions, digital cameras, mobile telephones and flat computers including these display devices.

What are described above is related to the illustrative embodiments of the disclosure only and not limitative to the scope of the disclosure; the scopes of the disclosure are defined by the accompanying claims.

The invention claimed is:

1. A touch panel comprising a first sensing electrode layer, a second sensing electrode layer, and an insulating layer between the first sensing electrode layer and the second sensing electrode layer,
    wherein the first sensing electrode layer comprises first sensing electrode patterns; the second sensing electrode layer comprises second sensing electrode patterns; and the insulating layer comprises insulating patterns, and
    a size of the insulating patterns is the same as that of the first sensing electrode patterns or the second sensing electrode patterns when viewed in a direction perpendicular to the substrate plane.

2. A manufacturing method for the touch panel of claim 1, comprising steps of forming the first sensing electrode layer, forming the insulating layer and forming the second sensing electrode layer;
    wherein forming of the first sensing electrode layer and the insulating layer uses a same mask for patterning, or forming of the insulating layer and the second sensing electrode layer uses a same mask for patterning.

3. The manufacturing method of claim 2, wherein the insulating layer and the first sensing electrode layer or the second sensing electrode layer are formed by one patterning process.

4. The manufacturing method of claim 3, wherein forming of the insulating layer and the first sensing electrode layer by one patterning process comprises:
    forming a first sensing electrode film on a substrate;
    forming an insulating film on the substrate;
    coating photoresist on the substrate formed with the first sensing electrode film and the insulating film;

exposing and developing the substrate formed with the photoresist with a mask, remaining parts of the photoresist after development corresponding to the first sensing electrode patterns and the insulating patterns, and other parts of photoresist being completed removed;

etching regions of the first sensing electrode film and the insulating film not covered by the photoresist; and removing the photoresist.

5. The manufacturing method of claim 4, wherein the mask comprises completely transparent regions and opaque regions;

where the photoresist is positive photoresist, opaque regions of the mask correspond to remaining parts of the photoresist, and photoresist corresponding to the transparent regions is completely removed; or where the photoresist is negative photoresist, transparent regions of the mask correspond to remaining parts of the photoresist, and photoresist corresponding to the opaque regions is completely removed.

6. The manufacturing method of claim 3, wherein forming of the insulating layer and the second sensing electrode layer by one patterning process comprises:

forming an insulating film on a substrate;

forming a second sensing electrode film on the substrate;

coating photoresist on the substrate formed with the insulating film and the second sensing electrode film;

exposing and developing the substrate formed with the photoresist with a mask, remaining parts of the photoresist after development corresponding to the insulating patterns and the second sensing electrode patterns, and other parts of photoresist being completed removed;

etching regions of the insulating film and the second sensing electrode film not covered by the photoresist; and removing the photoresist.

7. The manufacturing method of claim 6, wherein the mask comprises completely transparent regions and opaque regions;

where the photoresist is positive photoresist, opaque regions of the mask correspond to remaining parts of the photoresist, and photoresist corresponding to the transparent regions is completely removed; or where the photoresist is negative photoresist, transparent regions of the mask correspond to remaining parts of the photoresist, and photoresist corresponding to the opaque regions is completely removed.

8. A display device comprising the touch panel of claim 1.

* * * * *